(12) United States Patent
Lin et al.

(10) Patent No.: US 12,557,690 B2
(45) Date of Patent: Feb. 17, 2026

(54) PACKAGE STRUCTURES

(71) Applicant: Taiwan Semiconductor Manufacturing Company, Ltd., Hsinchu (TW)

(72) Inventors: Jing-Cheng Lin, Hsinchu (TW); Szu-Wei Lu, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 19/025,256

(22) Filed: Jan. 16, 2025

(65) Prior Publication Data

US 2025/0157870 A1     May 15, 2025

Related U.S. Application Data

(60) Continuation of application No. 17/208,431, filed on Mar. 22, 2021, now Pat. No. 12,237,238, which is a
(Continued)

(51) Int. Cl.
*H01L 23/31*     (2006.01)
*H01L 21/56*     (2006.01)
(Continued)

(52) U.S. Cl.
CPC ........ *H01L 23/3128* (2013.01); *H01L 21/565* (2013.01); *H01L 21/6835* (2013.01);
(Continued)

(58) Field of Classification Search
CPC .......... H01L 21/02697; H01L 21/4857; H01L 21/50; H01L 21/52; H01L 21/56–568;
(Continued)

(56) References Cited

U.S. PATENT DOCUMENTS 7,417,311 B2    8/2008   Yamano
7,741,148 B1    6/2010   Marimuthu et al.
(Continued)

FOREIGN PATENT DOCUMENTS

CN     1630029 A     3/2008
CN    102169875 A     8/2011
(Continued)

*Primary Examiner* — Andres Munoz
(74) *Attorney, Agent, or Firm* — Slater Matsil, LLP

(57) ABSTRACT

In an embodiment, a device includes: a substrate having a first side and a second side opposite the first side; an interconnect structure adjacent the first side of the substrate; and an integrated circuit device attached to the interconnect structure; a through via extending from the first side of the substrate to the second side of the substrate, the through via being electrically connected to the integrated circuit device; an under bump metallurgy (UBM) adjacent the second side of the substrate and contacting the through via; a conductive bump on the UBM, the conductive bump and the UBM being a continuous conductive material, the conductive bump laterally offset from the through via; and an underfill surrounding the UBM and the conductive bump.

20 Claims, 18 Drawing Sheets

Related U.S. Application Data continuation of application No. 16/588,473, filed on Sep. 30, 2019, now Pat. No. 10,957,616, which is a division of application No. 16/045,522, filed on Jul. 25, 2018, now Pat. No. 10,510,634.

(60) Provisional application No. 62/592,985, filed on Nov. 30, 2017.

(51) Int. Cl.
  H01L 21/683 (2006.01)
  H01L 23/00 (2006.01)
  H01L 23/14 (2006.01)
  H01L 23/48 (2006.01)
  H01L 23/498 (2006.01)
  H01L 23/538 (2006.01)

(52) U.S. Cl.
  CPC .......... H01L 23/142 (2013.01); H01L 23/147 (2013.01); H01L 23/3114 (2013.01); H01L 23/481 (2013.01); H01L 23/49816 (2013.01); H01L 23/49827 (2013.01); H01L 23/5383 (2013.01); H01L 23/5384 (2013.01); H01L 24/14 (2013.01); H01L 24/17 (2013.01); H01L 2221/68345 (2013.01); H01L 2221/68359 (2013.01); H01L 2224/73204 (2013.01); H01L 2924/181 (2013.01)

(58) Field of Classification Search
  CPC ....... H01L 21/6835; H01L 23/142–147; H01L 23/3107–315; H01L 23/481; H01L 23/488; H01L 23/498–49894; H01L 23/50; H01L 23/5226; H01L 23/5383; H01L 23/58384; H01L 24/11; H01L 24/14; H01L 24/17; H01L 2221/68345; H01L 2221/68359; H01L 2224/113; H01L 2224/141; H01L 2224/1412; H01L 2224/73204; H01L 2924/181
  See application file for complete search history.

(56) References Cited

U.S. PATENT DOCUMENTS

| | | |
|---|---|---|
| 8,101,496 B2 | 1/2012 | Takao |
| 8,680,647 B2 | 3/2014 | Yu et al. |
| 8,736,050 B2 | 5/2014 | Huang et al. |
| 8,759,150 B2 | 6/2014 | Hu et al. |
| 8,829,676 B2 | 9/2014 | Yu et al. |
| 8,993,377 B2 | 3/2015 | Koo et al. |
| 8,993,380 B2 | 3/2015 | Hou et al. |
| 9,142,510 B2 | 9/2015 | Lee et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,633,869 B2 | 4/2017 | Chiu et al. |
| 9,666,502 B2 | 5/2017 | Chen et al. |
| 9,735,131 B2 | 8/2017 | Su et al. |
| 9,754,868 B2 | 9/2017 | Chiang et al. |
| 9,786,593 B1 | 10/2017 | Lin |
| 9,793,246 B1 | 10/2017 | Tseng et al. |
| 9,842,775 B2 | 12/2017 | Marimuthu et al. |
| 10,134,708 B2 | 11/2018 | Yu et al. |
| 10,297,550 B2 | 5/2019 | Hu et al. |
| 10,957,616 B2 * | 3/2021 | Lin ..................... H01L 23/5383 |
| 12,237,238 B2 * | 2/2025 | Lin ..................... H01L 23/5384 |
| 2003/0102551 A1 | 6/2003 | Kikuchi |
| 2009/0020864 A1 | 1/2009 | Pu et al. |
| 2009/0309212 A1 | 12/2009 | Shim et al. |
| 2010/0090318 A1 | 4/2010 | Hsu et al. |
| 2010/0133704 A1 | 6/2010 | Marimuthu et al. |
| 2010/0276787 A1 | 11/2010 | Yu et al. |
| 2010/0308474 A1 | 12/2010 | Shibuya et al. |
| 2011/0074041 A1 | 3/2011 | Leung et al. |
| 2011/0165776 A1 | 7/2011 | Hsu et al. |
| 2011/0193221 A1 | 8/2011 | Hu et al. |
| 2012/0061823 A1 | 3/2012 | Wu et al. |
| 2012/0098123 A1 | 4/2012 | Yu et al. |
| 2013/0040423 A1 | 2/2013 | Tung et al. |
| 2013/0134559 A1 | 5/2013 | Lin et al. |
| 2013/0193593 A1 | 8/2013 | Lin et al. |
| 2013/0277829 A1 | 10/2013 | Yee et al. |
| 2014/0117546 A1 | 5/2014 | Liu et al. |
| 2014/0131856 A1 | 5/2014 | Do et al. |
| 2014/0217610 A1 | 8/2014 | Jeng et al. |
| 2015/0021785 A1 | 1/2015 | Lin |
| 2015/0048503 A1 * | 2/2015 | Chiu .................. H01L 21/4853 438/126 |
| 2015/0108635 A1 | 4/2015 | Liang et al. |
| 2015/0130058 A1 | 5/2015 | Chen et al. |
| 2015/0171006 A1 | 6/2015 | Hung et al. |
| 2015/0179590 A1 | 6/2015 | Fu et al. |
| 2015/0318262 A1 | 11/2015 | Gu et al. |
| 2016/0013133 A1 | 1/2016 | Gu et al. |
| 2016/0163564 A1 | 6/2016 | Yu et al. |
| 2017/0141055 A1 | 5/2017 | Liu et al. |
| 2017/0154850 A1 | 6/2017 | Kao et al. |
| 2017/0271283 A1 | 9/2017 | Lee et al. |
| 2018/0331055 A1 | 11/2018 | Huang et al. |

FOREIGN PATENT DOCUMENTS

| | | |
|---|---|---|
| CN | 104377171 A | 2/2015 |
| KR | 20100119507 A | 11/2010 |
| KR | 20130061037 A | 6/2013 |
| KR | 20160093948 A | 8/2016 |
| KR | 20170063345 A | 6/2017 |
| TW | 201724382 A | 7/2017 |
| TW | M548889 U | 9/2017 |
| TW | 201737455 A | 10/2017 |

* cited by examiner

PACKAGE STRUCTURES

PRIORITY CLAIM AND CROSS-REFERENCE

This application is a continuation of U.S. patent application Ser. No. 17/208,431, filed on Mar. 22, 2021, entitled "Package Structure and Method," which is a continuation of U.S. patent application Ser. No. 16/588,473, filed on Sep. 30, 2019, entitled "Package Structure and Method," now U.S. Pat. No. 10,957,616 issued on Mar. 23, 2021, which is a division of U.S. patent application Ser. No. 16/045,522, filed on Jul. 25, 2018, entitled "Package Structure and Method," now U.S. Pat. No. 10,510,634 issued on Dec. 17, 2019, which claims the benefit of U.S. Provisional Application Ser. No. 62/592,985, filed on Nov. 30, 2017, which applications are hereby incorporated herein by reference in their entireties.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Interposers have been used to redistribute ball contact areas from that of the chip to a larger area of the interposer. Further, interposers have allowed for a three-dimensional (3D) package that includes multiple chips. Other packages have also been developed to incorporate 3D aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
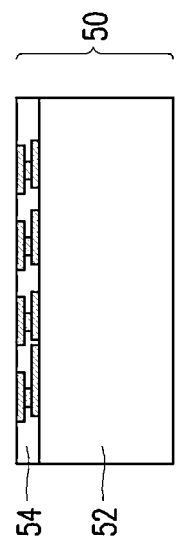
FIG. 1 is a cross-sectional view of an integrated circuit device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an under bump metallurgy (UBM) is formed to laterally offset a subsequently formed conductive connector from a through via of an interposer. A buffer layer may also be formed between the UBM and a main substrate of the interposer. Forces exerted by the conductive connectors on the interposer during thermal testing may thus be reduced. Further, in accordance with some embodiments, the process for forming the UBM may use a single ashing process, resulting in reduced manufacturing costs.

FIG. 1 is a cross-sectional view of an integrated circuit device 50, in accordance with some embodiments. The integrated circuit device 50 may be a logic die (e.g., central processing unit (CPU), graphics processing unit (GPU), system-on-a-chip (SoC), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or a combination thereof. The integrated circuit device 50 may be formed in a wafer, which may include different device regions that are singulated in subsequent steps to form a plurality of integrated circuit devices 50. The integrated circuit device 50 includes a substrate 52 and an interconnect structure 54.

The substrate 52 may include a bulk semiconductor substrate, semiconductor-on-insulator (SOI) substrate, multi-layered semiconductor substrate, or the like. The semiconductor material of the substrate 52 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 52 may be doped or undoped. Devices, such as transistors, capacitors, resistors, diodes, and the like, may be formed in and/or on an active surface (e.g., the surface facing upward) of the substrate 52.

An interconnect structure 54 having one or more dielectric layer(s) and respective metallization pattern(s) is formed on the active surface of the substrate 52. The dielectric layer(s) may be inter-metallization dielectric (IMD) layers. The IMD layers may be formed, for example, of a low-K dielectric material, such as undoped silicate glass (USG), phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, by any suitable method known in the art, such as spin coating, chemical vapor deposition (CVD), plasma-enhanced CVD (PECVD), high-density plasma chemical vapor deposition (HDP-CVD), or the like. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like. Additionally, die connectors such as conductive pillars or contact pads, are formed in and/or on the interconnect structure 54 to provide an external electrical connection to the circuitry and devices. One of ordinary skill in the art will appreciate that the above examples are provided for illustrative purposes. Other circuitry may be used as appropriate for a given application.

Although it is shown as having a single substrate 52, it should be appreciated that the integrated circuit device 50 may include multiple substrates 52. For example, the integrated circuit device 50 may be a stacked device such as a hybrid memory cube (HMC) module, a high bandwidth memory (HBM) module, or the like. In such embodiments, the integrated circuit device 50 includes multiple substrates 52 interconnected by vias.

Figure 2:
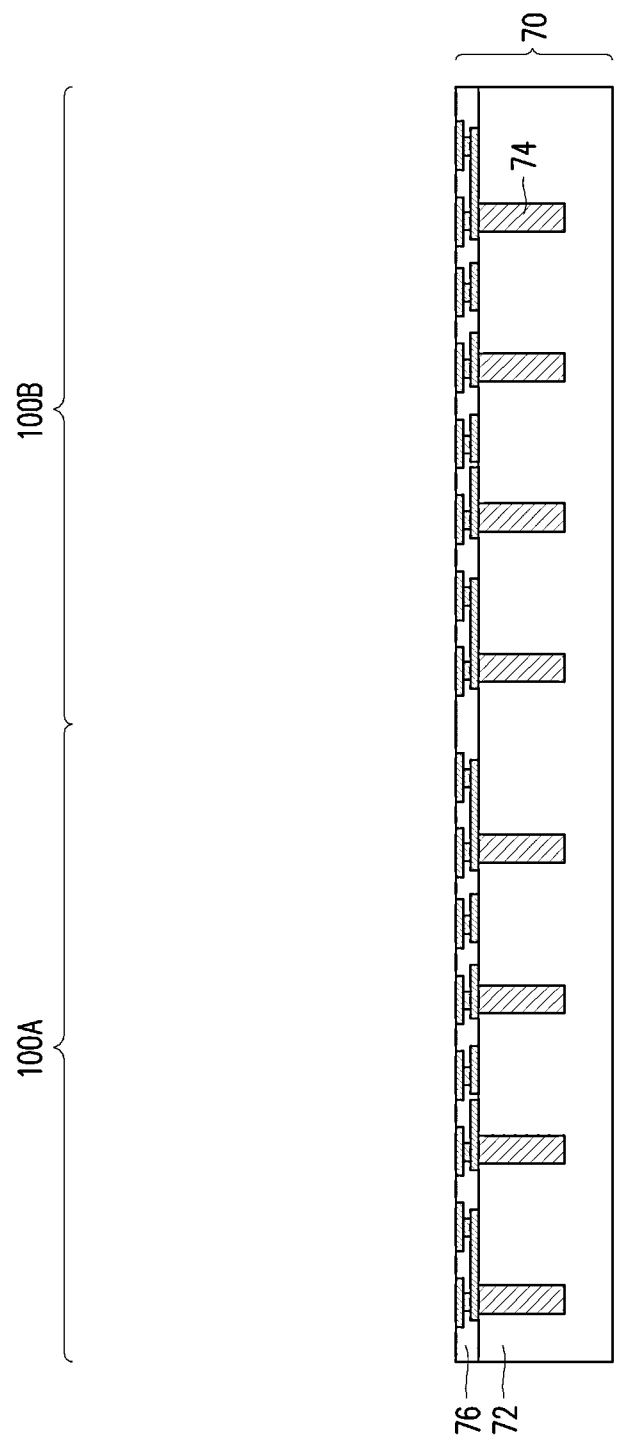
FIG. 2 is a cross-sectional view of a wafer, in accordance with some embodiments.

FIG. 2 is a cross-sectional view of a wafer 70, in accordance with some embodiments. The wafer 70 includes multiple device regions 100A and 100B, in which the integrated circuit device 50 will be attached to form a plurality of devices. The devices formed in the wafer 70 may be interposers, integrated circuits dies, or the like. The wafer 70 includes a substrate 72, through vias 74, and an interconnect structure 76.

The substrate 72 may be a bulk semiconductor substrate, SOI substrate, multi-layered semiconductor substrate, or the like. The semiconductor material of the substrate 72 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 72 may be doped or undoped. In embodiments where interposers are formed in the wafer 70, the substrate 72 generally does not include active devices therein, although the interposers may include passive devices formed in and/or on a front surface (e.g., the surface facing upward) of the substrate 72. In embodiments where integrated circuits dies are formed in the wafer 70, devices such as transistors, capacitors, resistors, diodes, and the like, may be formed in and/or on the front surface of the substrate 72.

The through vias 74 are formed to extend from the front surface of the substrate 72 into substrate 72. The through vias 74 are also sometimes referred to as through-substrate vias or through-silicon vias (TSVs) when the substrate 72 is a silicon substrate. The through vias 74 may be formed by forming recesses in the substrate 72 by, for example, etching, milling, laser techniques, a combination thereof, and/or the like. A thin dielectric material may be formed in the recesses, such as by using an oxidation technique. A thin barrier layer may be conformally deposited over the front side of the substrate 72 and in the openings, such as by CVD, atomic layer deposition (ALD), physical vapor deposition (PVD), thermal oxidation, a combination thereof, and/or the like. The barrier layer may be formed from a nitride or an oxynitride, such as titanium nitride, titanium oxynitride, tantalum nitride, tantalum oxynitride, tungsten nitride, a combination thereof, and/or the like. A conductive material may be deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from the front side of the substrate 72 by, for example, a chemical-mechanical polish (CMP). Thus, the through vias 74 may include a conductive material, with a thin barrier layer between the conductive material and the substrate 72.

The interconnect structure 76 is formed over the front surface of the substrate 72, and is used to electrically connect the integrated circuit devices (if any) and/or through vias 74 together and/or to external devices. The interconnect structure 76 may include one or more dielectric layer(s) and respective metallization pattern(s) in the dielectric layer(s). The metallization patterns may include vias and/or traces to interconnect any devices and/or through vias 74 together and/or to an external device. The dielectric layers may be formed from silicon oxide, silicon nitride, silicon carbide, silicon oxynitride, low-K dielectric material, such as PSG, BPSG, FSG, $SiO_xC_y$, Spin-On-Glass, Spin-On-Polymers, silicon carbon material, compounds thereof, composites thereof, combinations thereof, or the like. The dielectric layers may be deposited by any suitable method known in the art, such as spin coating, CVD, PECVD, HDP-CVD, or the like. A metallization pattern may be formed in the dielectric layer, for example, by using photolithography techniques to deposit and pattern a photoresist material on the dielectric layer to expose portions of the dielectric layer that are to become the metallization pattern. An etch process, such as an anisotropic dry etch process, may be used to create recesses and/or openings in the dielectric layer corresponding to the exposed portions of the dielectric layer. The recesses and/or openings may be lined with a diffusion barrier layer and filled with a conductive material. The diffusion barrier layer may be formed from one or more layers of TaN, Ta, TiN, Ti, CoW, or the like, deposited by ALD or the like, and the conductive material may be formed from copper, aluminum, tungsten, silver, combinations thereof, or the like, and may be deposited by CVD, PVD, or the like. Any excessive diffusion barrier layer and/or conductive material on the dielectric layer may be removed, such as by using a CMP.

Figure 17:
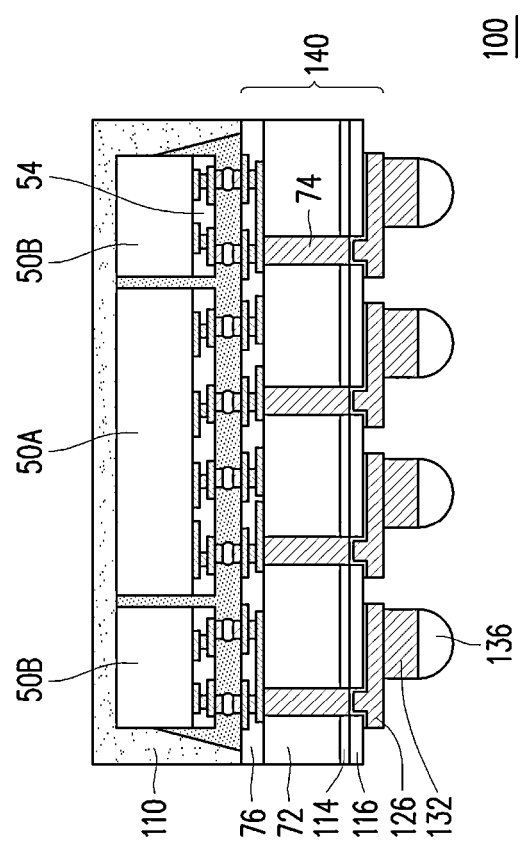
Figure 18:
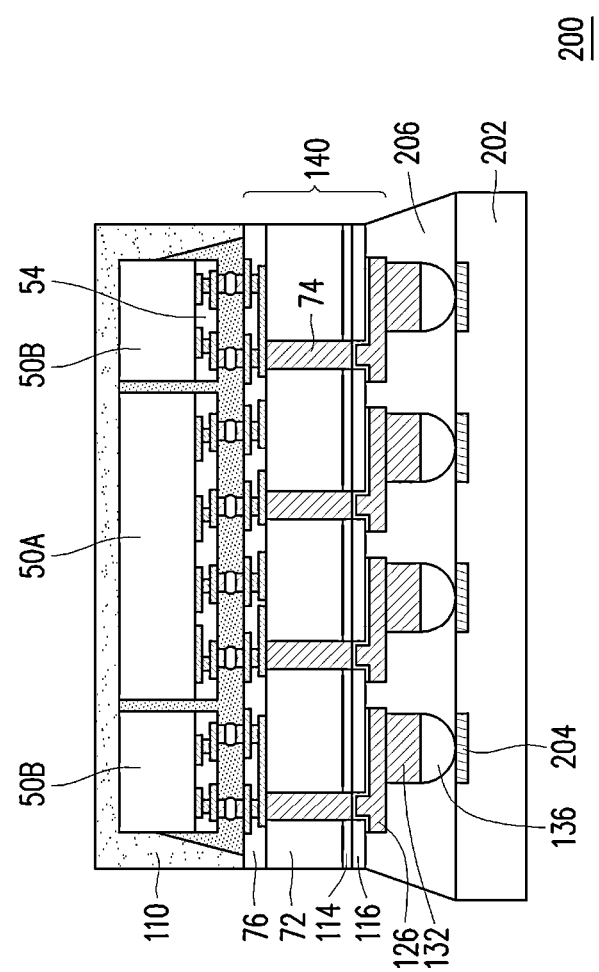

FIGS. 3 through 18 are various views of intermediate steps during a process for forming a device package 200, in accordance with some embodiments. FIGS. 3 through 18 are cross-sectional views. In FIGS. 3 through 16, a semiconductor device 100 is formed by bonding various integrated circuit devices 50 to the front side of the wafer 70. In an embodiment, the semiconductor device 100 is a chip-on-wafer (CoW) package, although it should be appreciated that embodiments may be applied to other three-dimensional integrated circuit (3DIC) packages. FIG. 17 shows the resulting semiconductor device 100. In FIG. 18, the device package 200 is formed by mounting the semiconductor device 100 to a substrate. In an embodiment, the device package 200 is a chip-on-wafer-on-substrate (CoWoS) package, although it should be appreciated that embodiments may be applied to other 3DIC packages.

Figure 3:
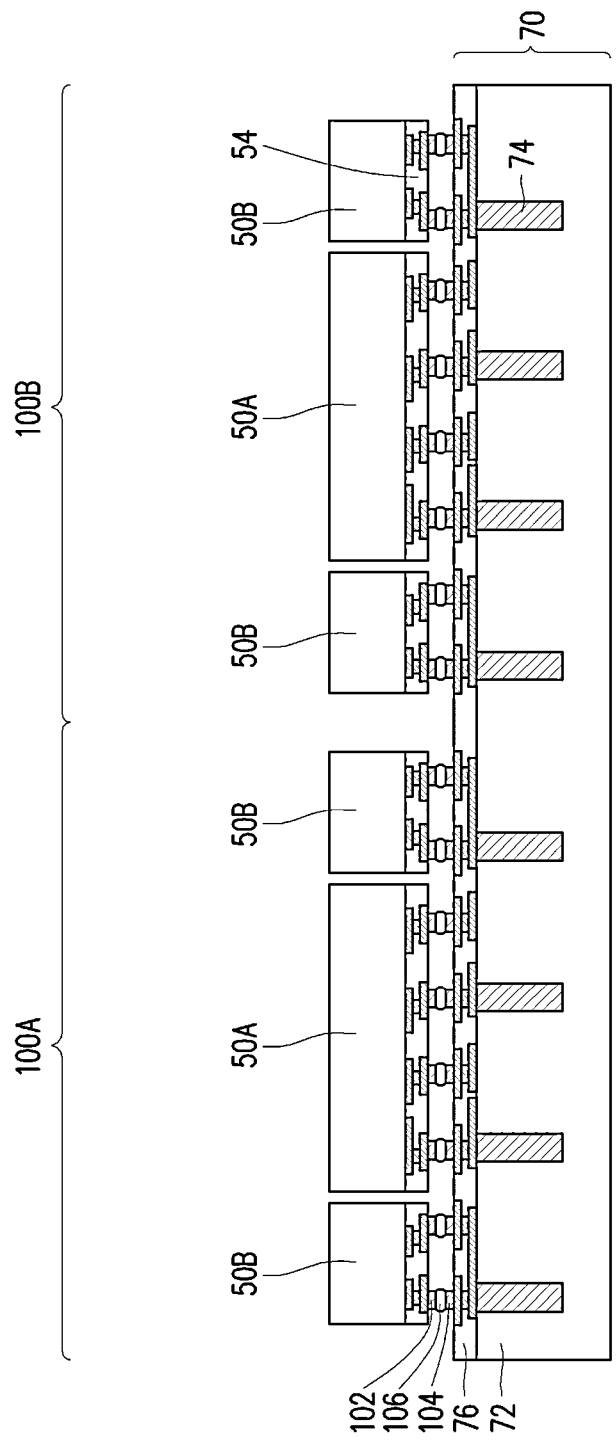
FIGS. 3 through 18 are various views of intermediate steps during a process for forming a device package, in accordance with some embodiments.

In FIG. 3, a plurality of integrated circuit devices 50 are attached to the interconnect structure 76. The integrated circuit devices 50 are located in the device regions 100A and 100B, which will be singulated in subsequent steps to form the semiconductor devices 100. The integrated circuit devices 50 include multiple devices 50A and 50B with different functions. The devices 50A and 50B may each have a single function (e.g., a logic device, memory die, etc.), or may have multiple functions (e.g., a SoC). In an embodiment, the devices 50A are logic devices such as CPUs and the devices 50B are memory devices such as HBM modules. The integrated circuit devices 50 may be attached to the interconnect structure 76 using, for example, a pick-and-place tool.

In the embodiment shown, the integrated circuit devices 50 are attached to the interconnect structure 76 with connections that include conductive bumps 102 and 104, and conductive connectors 106. The conductive bumps 102 and 104 are formed from a conductive material such as copper, aluminum, gold, nickel, palladium, the like, or a combination thereof and may be formed by sputtering, printing, electro plating, electroless plating, CVD, or the like. The conductive bumps 102 and 104 may be solder-free and have substantially vertical sidewalls, and may be referred to as μbumps. The conductive bumps 102 are electrically and physically connected to the interconnect structure 54, and the conductive bumps 104 are electrically and physically connected to the interconnect structure 76. The conductive connectors 106 bond the conductive bumps 102 and 104. The conductive connectors 106 may be formed from a conductive material such as solder, and may be formed by initially forming a layer of solder on the conductive bumps 102 or 104 through methods such as evaporation, electroplating, printing, solder transfer, ball placement, or the like. Once the layer of solder has been formed, a reflow process may be performed in order to shape the conductive connectors 106 into desired bump shapes.

In other embodiments, the integrated circuit devices 50 are attached to the interconnect structure 76 by face-to-face bonds. For example, hybrid bonding, fusion bonding, direct bonding, dielectric bonding, metal bonding, or the like may be used to attach the interconnect structures 54 and 76 without the use of solder. Further, a mix of bonding techniques could be used, e.g., some integrated circuit devices 50 could be bonded to the interconnect structure 76 by conductive connectors 106, and other integrated circuit devices 50 could be bonded to the interconnect structure 76 by face-to-face bonds.

Figure 4:
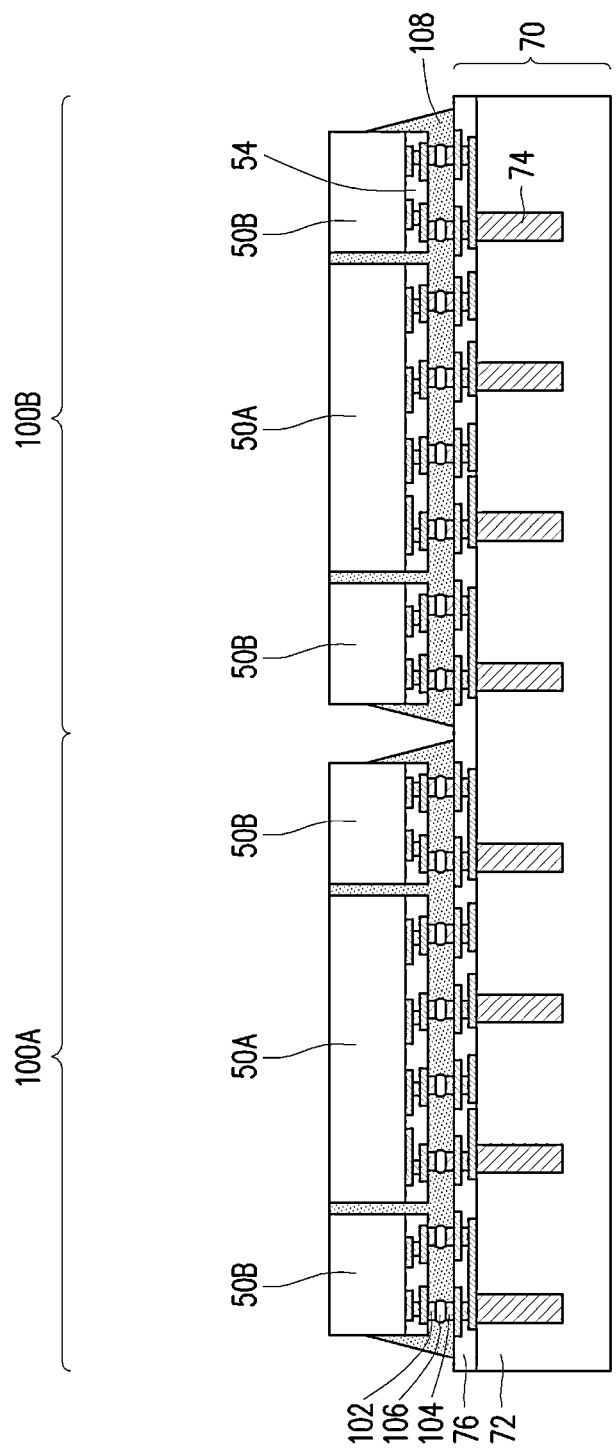

In FIG. 4, an underfill material 108 is dispensed into the gaps between the integrated circuit devices 50 and the interconnect structure 76. The underfill material 108 surrounds the conductive bumps 102 and 104 and the conductive connectors 106, and may extend up along sidewalls of the integrated circuit devices 50. The underfill material 108 may be any acceptable material, such as a polymer, epoxy, molding underfill, or the like. The underfill material 108 may be formed by a capillary flow process after the integrated circuit devices 50 are attached to the interconnect structure 76, or may be formed by a suitable deposition method before the integrated circuit devices 50 are attached.

Figure 5:
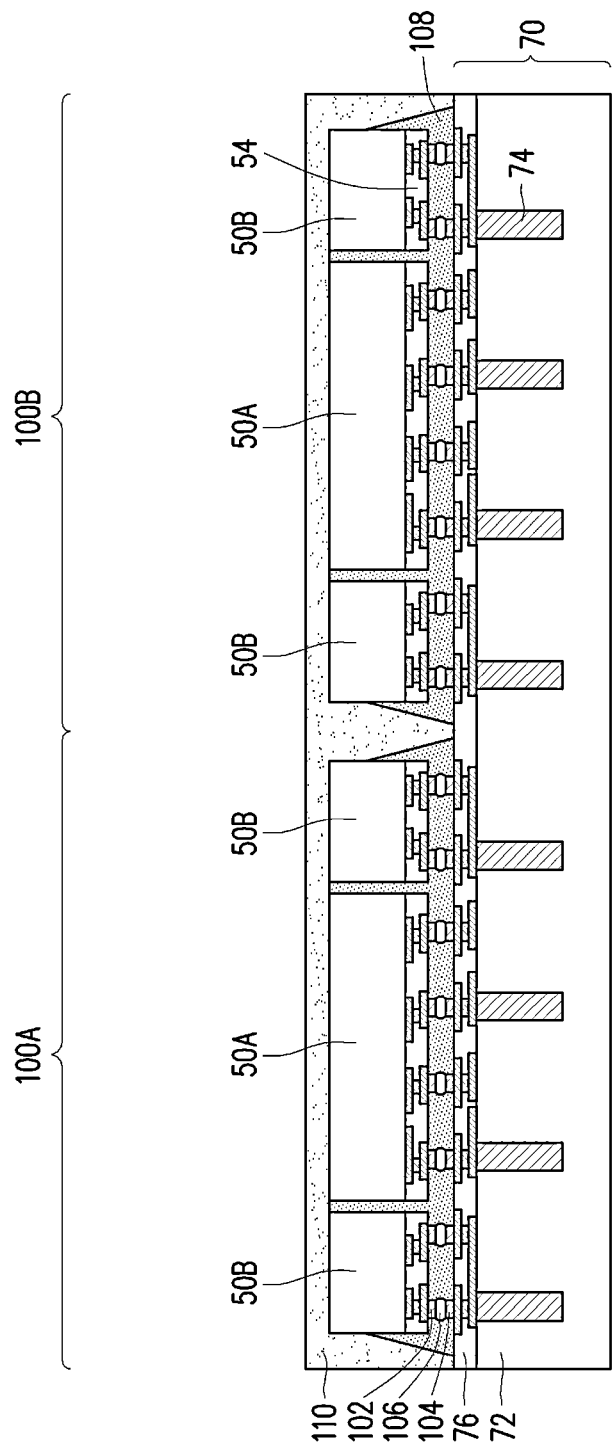

In FIG. 5, an encapsulant 110 is formed on the various components. The encapsulant 110 may be a molding compound, epoxy, or the like, and may be applied by compression molding, transfer molding, or the like. The encapsulant no may be formed over the interconnect structure 76 such that the integrated circuit devices 50 and underfill material 108 are buried or covered. The encapsulant no is then cured. In some embodiments, the encapsulant no is thinned such that top surfaces of the encapsulant no and integrated circuit devices 50 are level.

Figure 6:
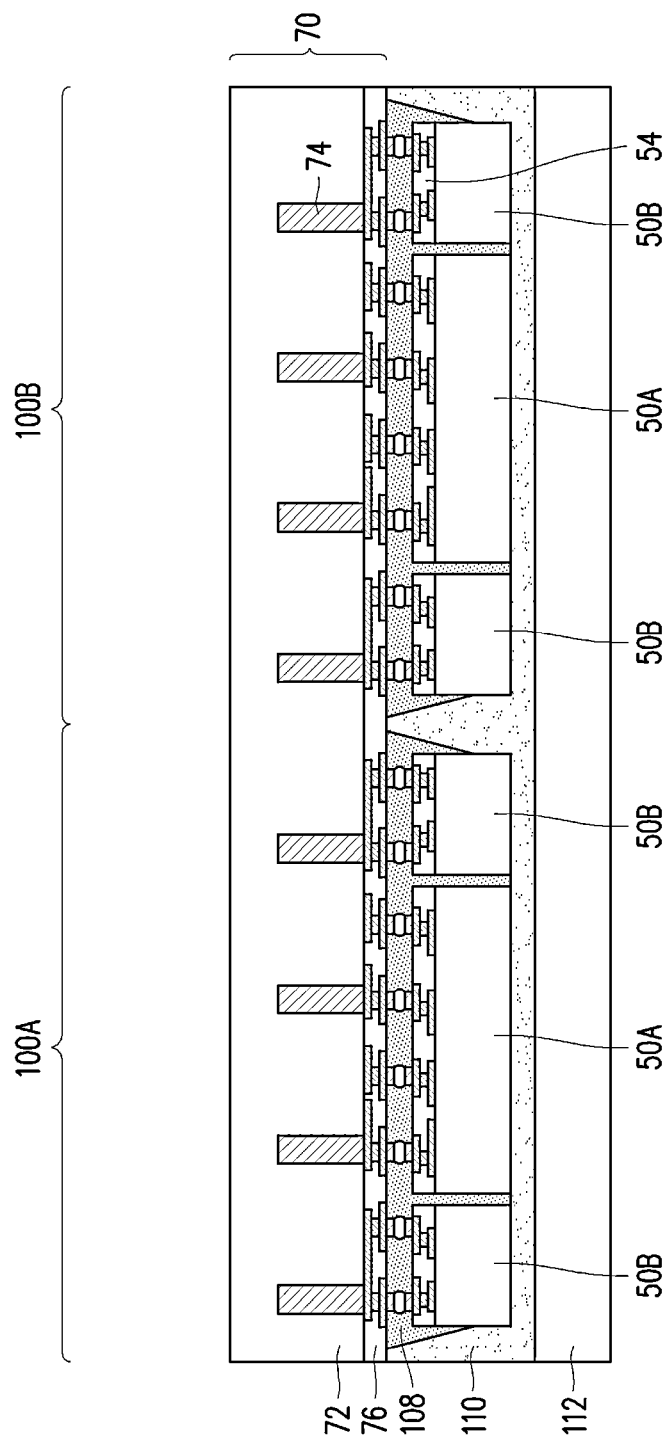

In FIG. 6, the intermediate structure is flipped over to prepare for processing of the back side of the substrate 72. The intermediate structure may be placed on a carrier substrate 112 or other suitable support structure for subsequent processing. For example, the carrier substrate 112 may be attached to the encapsulant no. The intermediate structure may be attached to the carrier substrate 112 by a release layer. The release layer may be formed of a polymer-based material, which may be removed along with the carrier substrate 112 from the overlying structures. In some embodiments, the carrier substrate 112 is a substrate such as a bulk semiconductor or a glass substrate, and may have any thickness, such as a thickness of about 300 mm. In some embodiments, the release layer is an epoxy-based thermal-release material, which loses its adhesive property when heated, such as a light-to-heat-conversion (LTHC) release coating.

Figure 7:
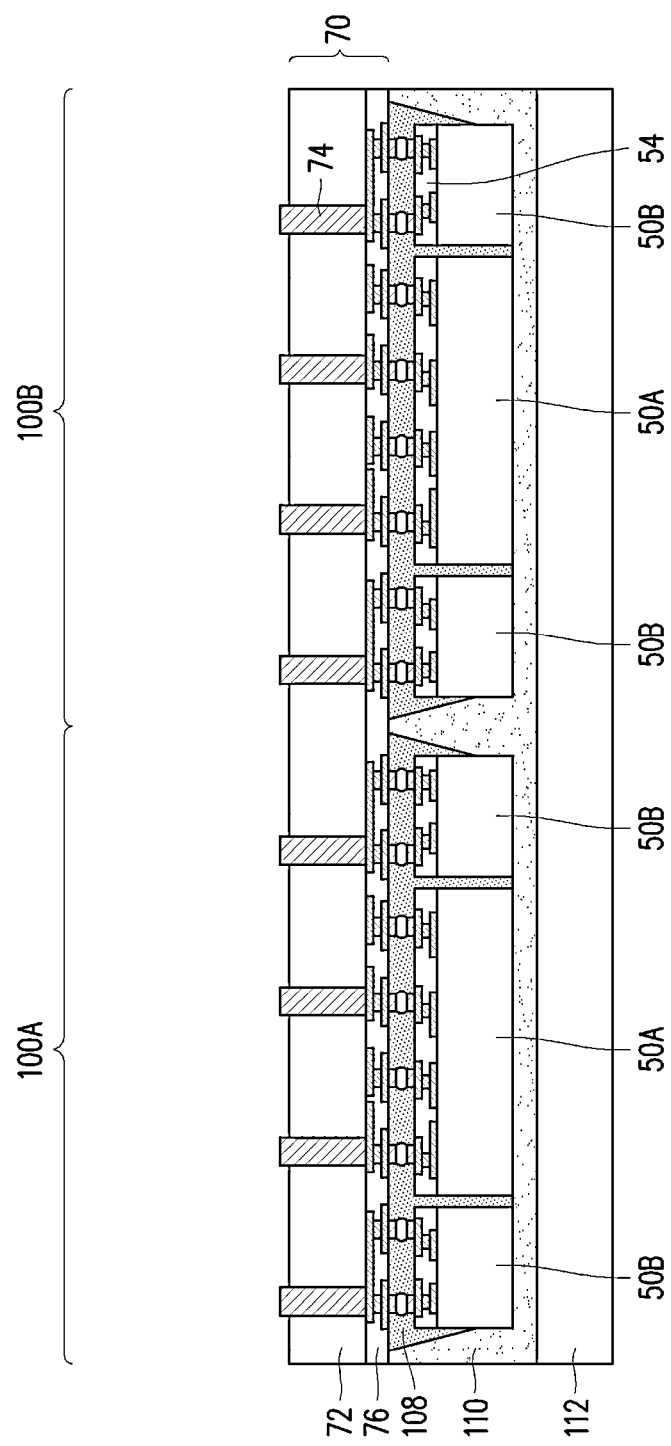

In FIG. 7, the substrate 72 is thinned to expose the through vias 74 such that the through vias 74 protrude from the back side of the substrate 72. Exposure of the through vias 74 may be accomplished in a two-step thinning process. First, a grinding process may be performed until the through vias 74 are exposed. The grinding process may be, e.g., a CMP or other acceptable removal process. After the grinding process, the back side of the substrate 72 and the through vias 74 may be level. Second, a recessing process may be performed to recess the substrate 72 around the through vias 74. The recessing process may be, e.g., a suitable etch-back process.

Figure 8:
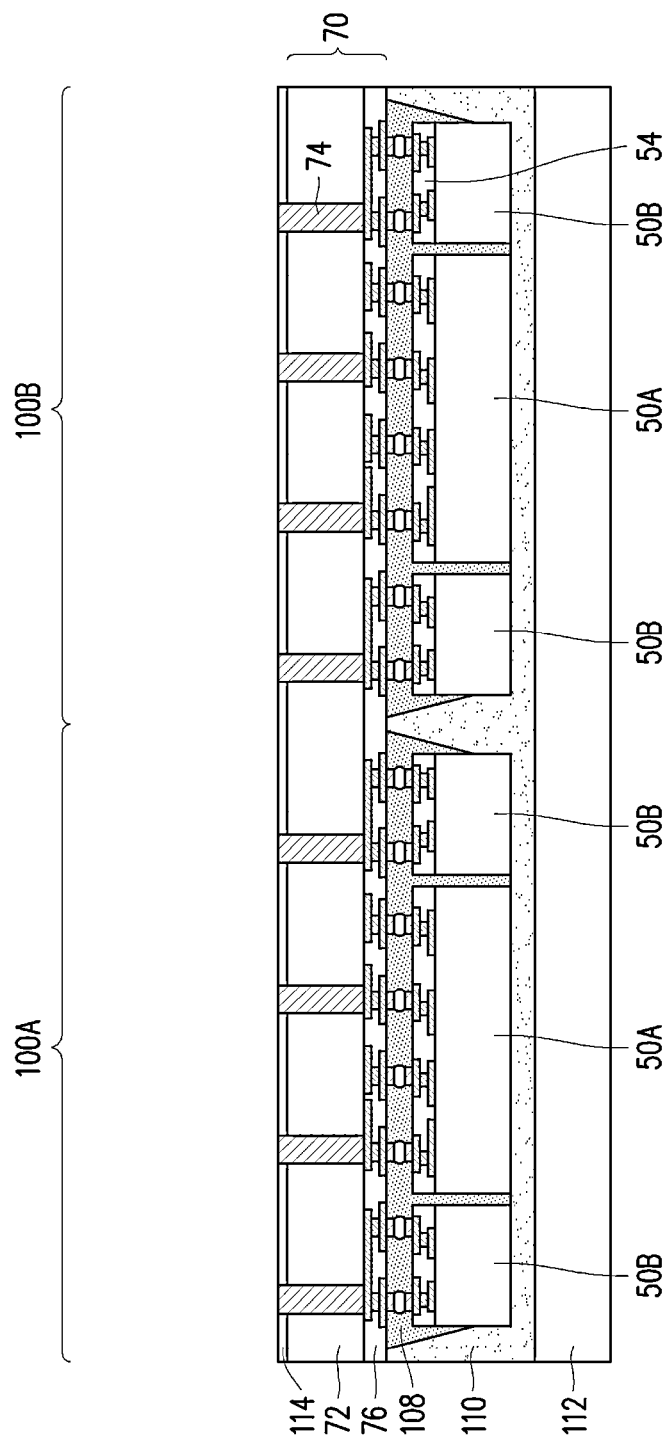

In FIG. 8, an insulating layer 114 is formed on the back side of the substrate 72, surrounding the protruding portions of the through vias 74. In some embodiments, the insulating layer 114 is formed from a silicon-containing insulator, such as, silicon nitride, silicon oxide, silicon oxynitride, or the like, and may be formed by a suitable deposition method such as spin coating, CVD, PECVD, HDP-CVD, or the like. After deposition, a planarization process such as a CMP may be performed to remove excess dielectric material such that surfaces of the insulating layer 114 and the through vias 74 are level.

Figure 9:
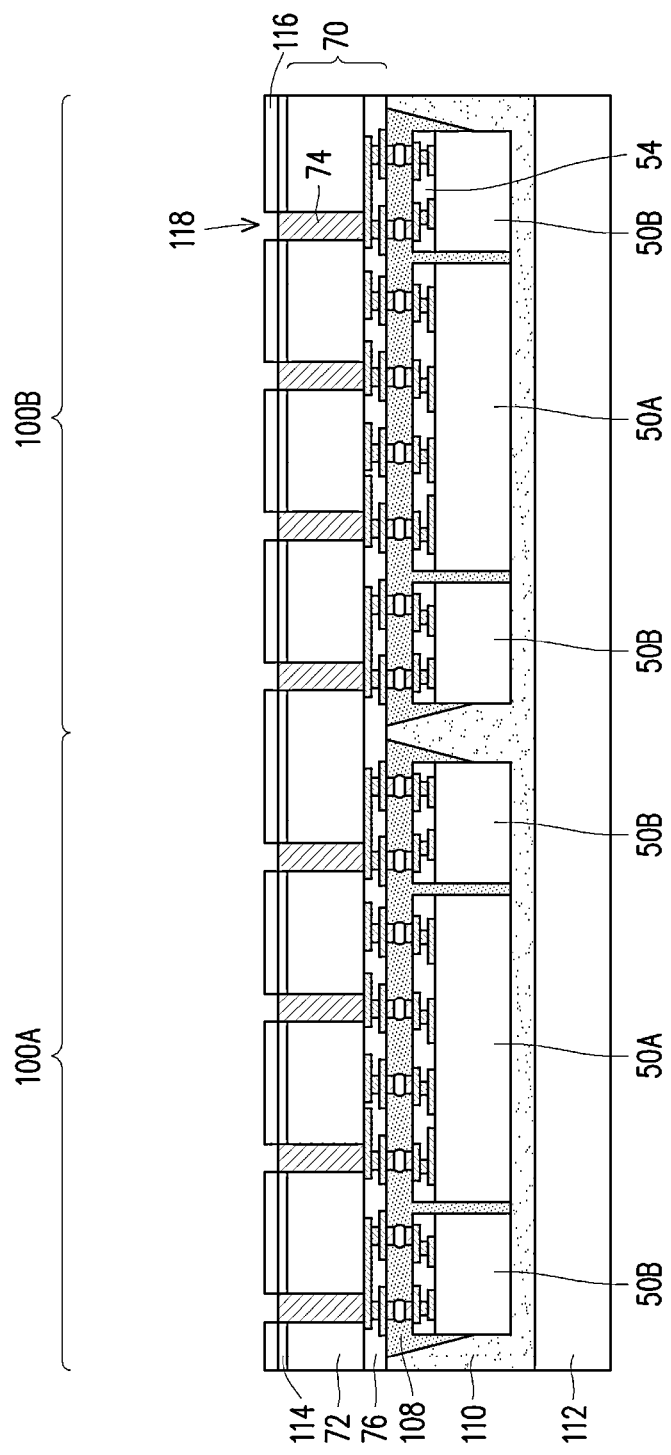

In FIG. 9, a dielectric layer 116 is formed over the insulating layer 114 and through vias 74. The dielectric layer 116 may be a photo-sensitive polymer material such as polybenzoxazole (PBO), a polyimide, benzocyclobutene (BCB), or the like, that may be patterned using a lithography mask. In other embodiments, the dielectric layer 116 is formed of a nitride such as silicon nitride; an oxide such as silicon oxide, PSG, borosilicate glass (BSG), BPSG; or the like. The dielectric layer 116 may be formed by spin coating, lamination, CVD, the like, or a combination thereof.

The dielectric layer 116 is then patterned. The patterning forms a pattern of openings 118 to expose portions of the through vias 74. The patterning may be by an acceptable process, such as by exposing the dielectric layer 116 to light when the dielectric layer 116 is a photo-sensitive material or by etching using, for example, an anisotropic etch. If the dielectric layer 116 is a photo-sensitive material, the dielectric layer 116 can be developed after the exposure.

Figure 10:
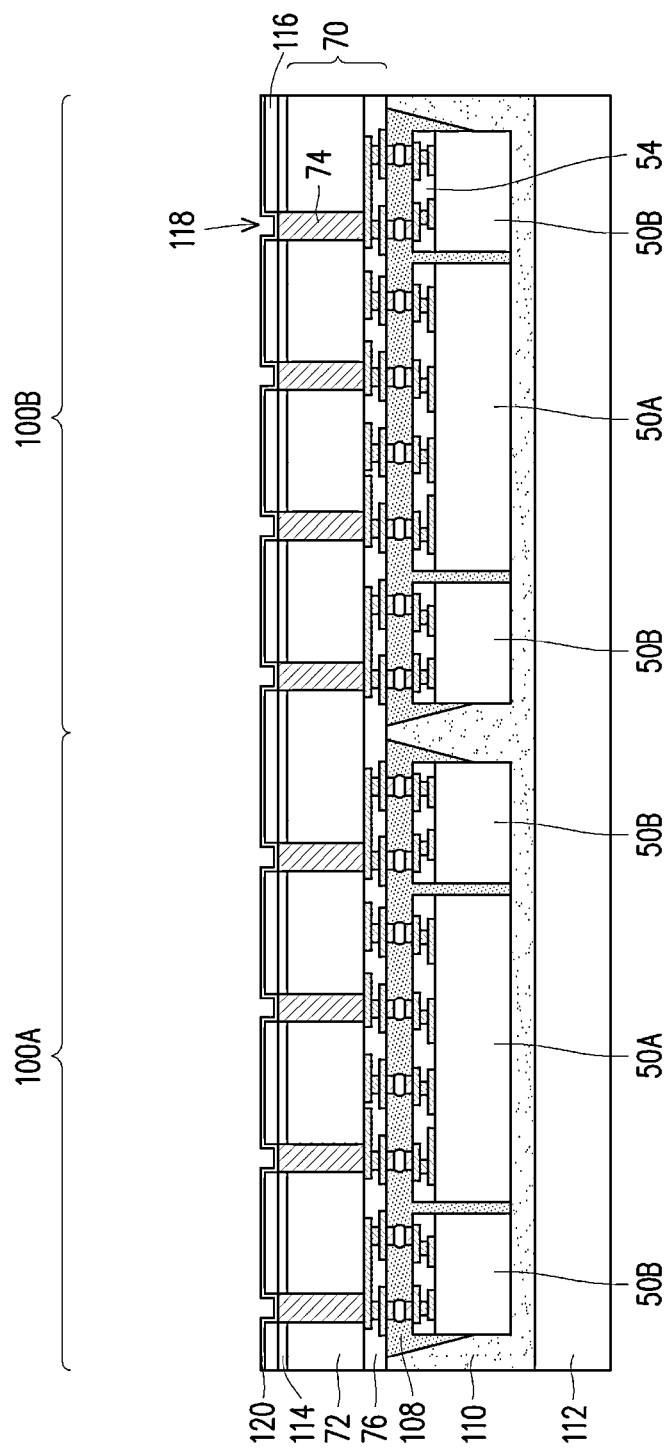

In FIG. 10, a seed layer 120 is formed over the dielectric layer 116 and in the openings 118 through the dielectric layer 116. In some embodiments, the seed layer is a metal layer, which may be a single layer or a composite layer having a plurality of sub-layers formed of different materials. In some embodiments, the seed layer includes a titanium layer and a copper layer over the titanium layer. The seed layer may be formed using, for example, PVD or the like.

Figure 11:
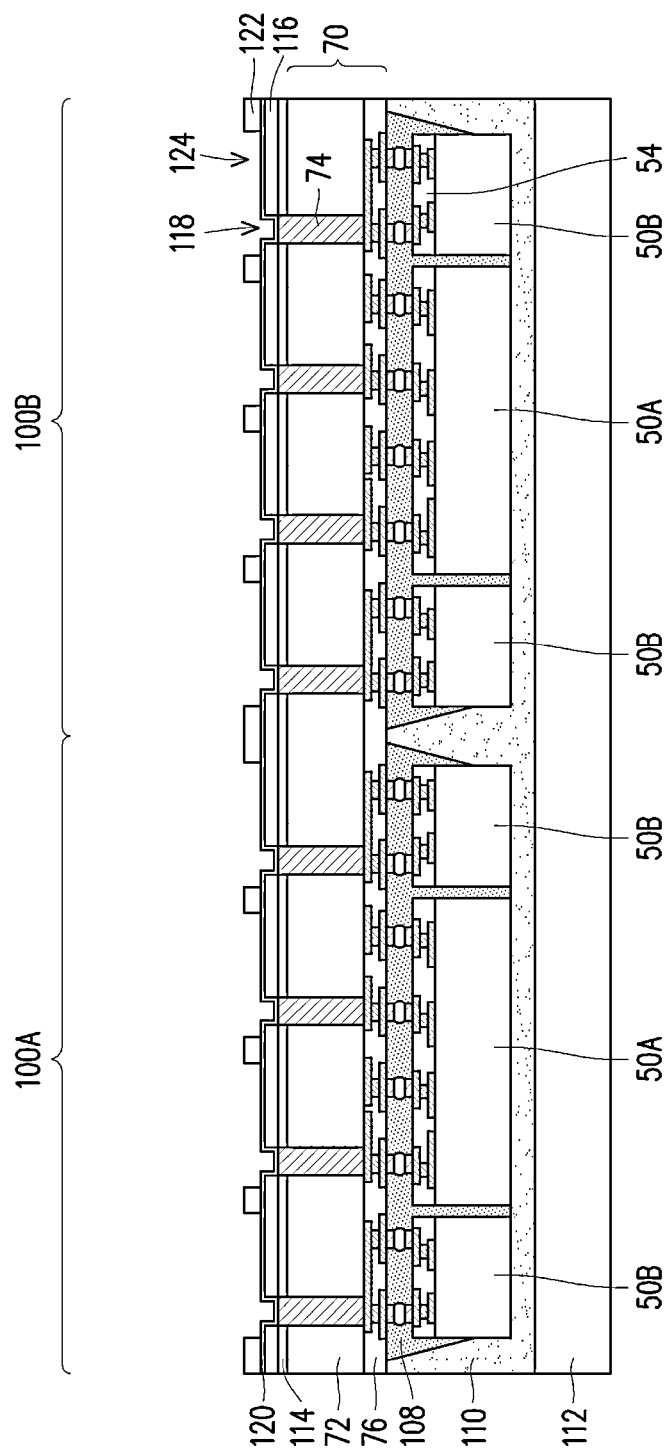

In FIG. 11, a first photoresist 122 is formed and patterned on the seed layer 120. The first photoresist 122 may be formed by spin coating or the like and may be exposed to light for patterning. The pattern of the first photoresist 122 corresponds to UBMs that will be subsequently formed. The patterning forms a pattern of openings 124 through the first photoresist 122, exposing portions of the seed layer 120. The openings 124 also expose the openings 118, and are over the through vias 74.

Figure 12:
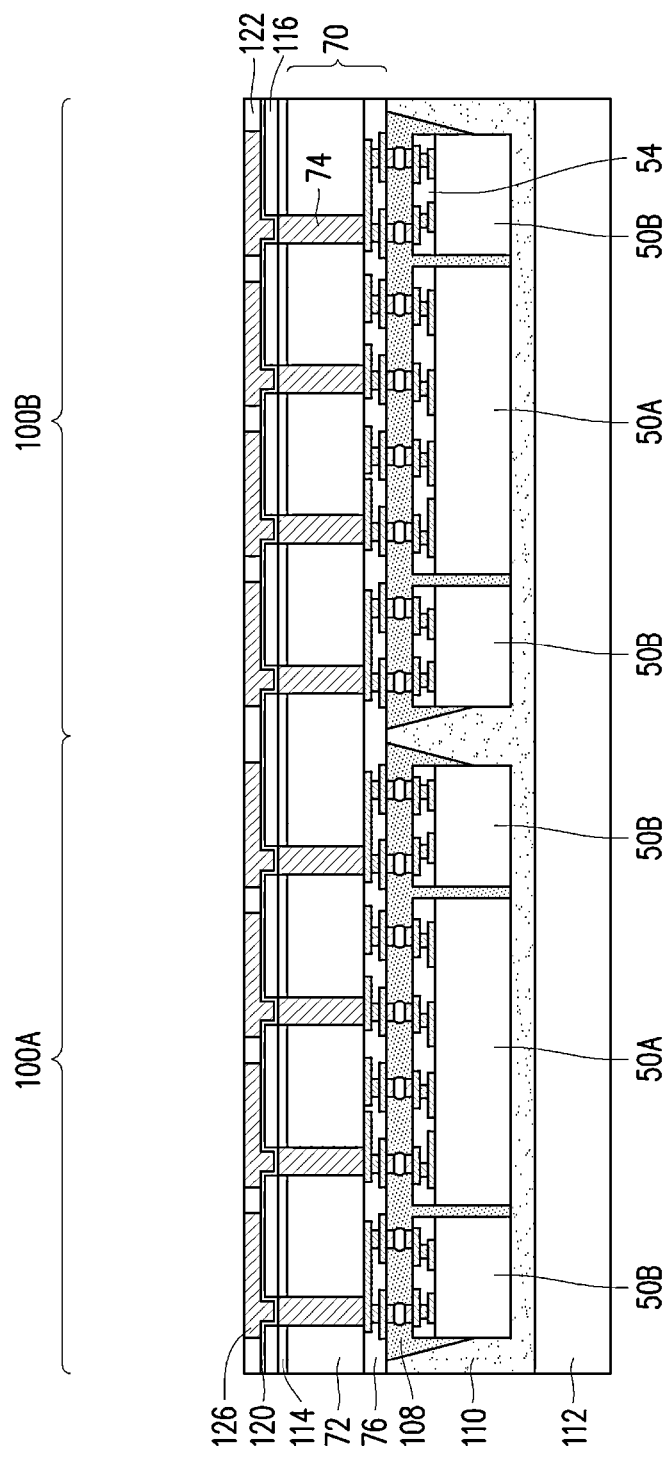

In FIG. 12, a conductive material is formed in the openings 124 of the first photoresist 122, on the exposed portions of the seed layer 120. The conductive material may be formed by plating, such as electroplating or electroless plating, or the like. The conductive material may be a metal, like copper, titanium, tungsten, aluminum, or the like. The combination of the conductive material and seed layer 120 forms UBMs 126. The UBMs 126 have via portions extending through the openings 118 in the dielectric layer 116 to contact the seed layer 120, and have line portions extending along the top surface of the dielectric layer 116.

Figure 13:
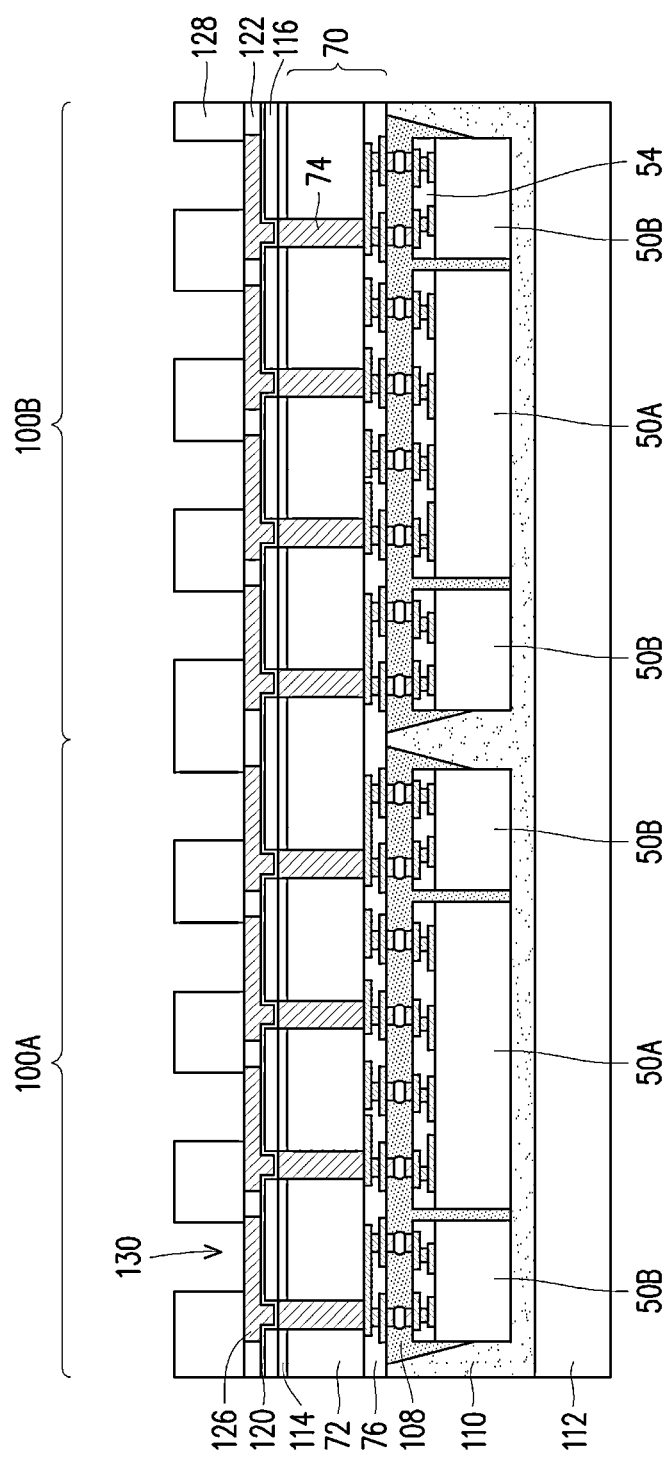

In FIG. 13, a second photoresist 128 is formed and patterned on the UBMs 126 and first photoresist 122. The second photoresist 128 may be formed by spin coating or the like and may be exposed to light for patterning. The second photoresist 128 may be formed from the same material as the first photoresist 122. The pattern of the second photoresist 128 corresponds to conductive bumps that will be subsequently formed. The patterning forms a pattern of openings 130 through the second photoresist 128, exposing portions of the UBMs 126.

Figure 14:
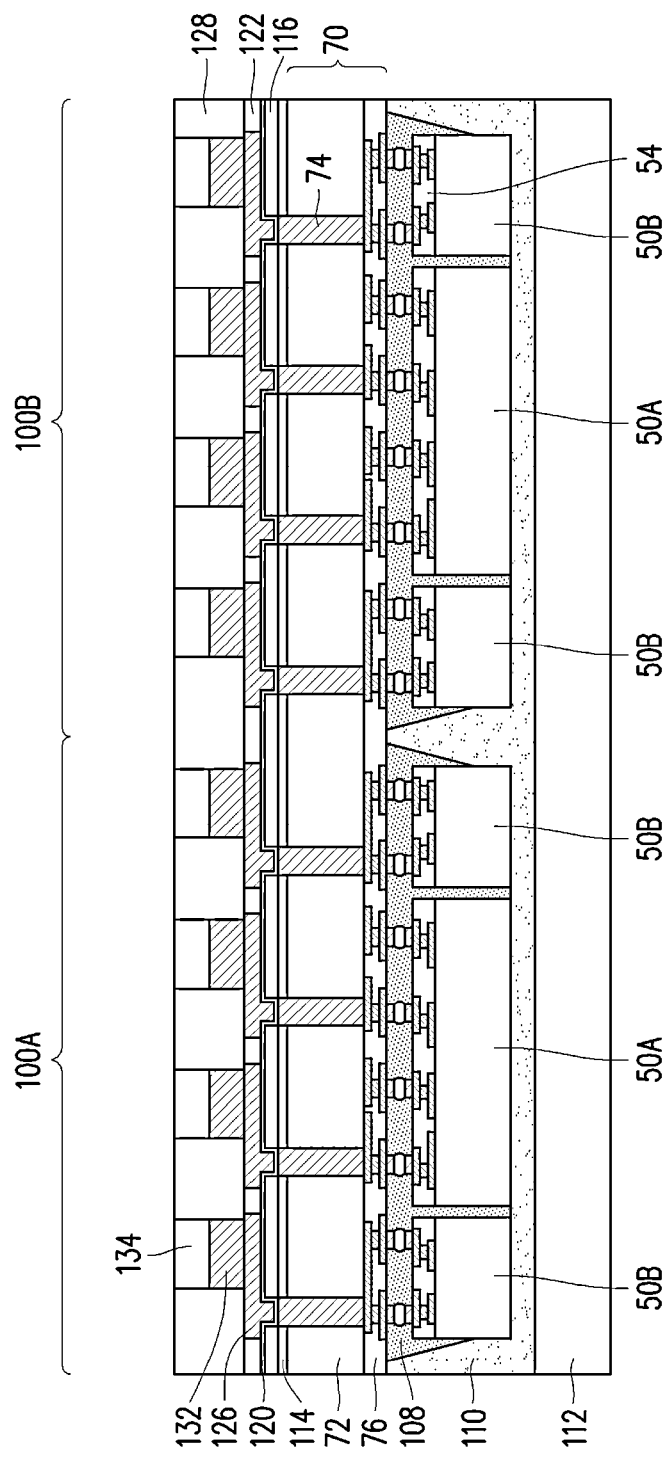

In FIG. 14, a conductive material is formed in the openings 130 of the second photoresist 128, on the exposed portions of the UBMs 126, thereby forming conductive bumps 132. The conductive material may be formed by plating, such as electroplating or electroless plating, or the like. The conductive material may be a metal, like copper, titanium, tungsten, aluminum, or the like. Because the UBMs 126 are exposed by the openings 130, no seed layer is formed in the openings 130. Rather, the conductive material is formed directly and physically on the UBMs 126. The conductive material is formed by performing a plating process with the same plating process parameters as the plating process used to form the conductive material of the UBMs 126. Notably, no seed layer is formed between the UBMs 126 and the conductive bumps 132. Rather, the conductive material of the conductive bumps 132 is formed by performing a plating process using the seed layer 120.

Further, a reflowable material 134 is formed on the conductive bumps 132 in the openings 130 of the second photoresist 128. The reflowable material 134 is a material such as solder, tin, silver, or the like, and may be formed by plating, evaporation, electroplating, printing, solder transfer, or the like. Because no seed layer is formed between the UBMs 126 and the conductive bumps 132, the conductive bumps 132 are a conductive material extending continuously from the UBMs 126 to the reflowable material 134.

Figure 15:
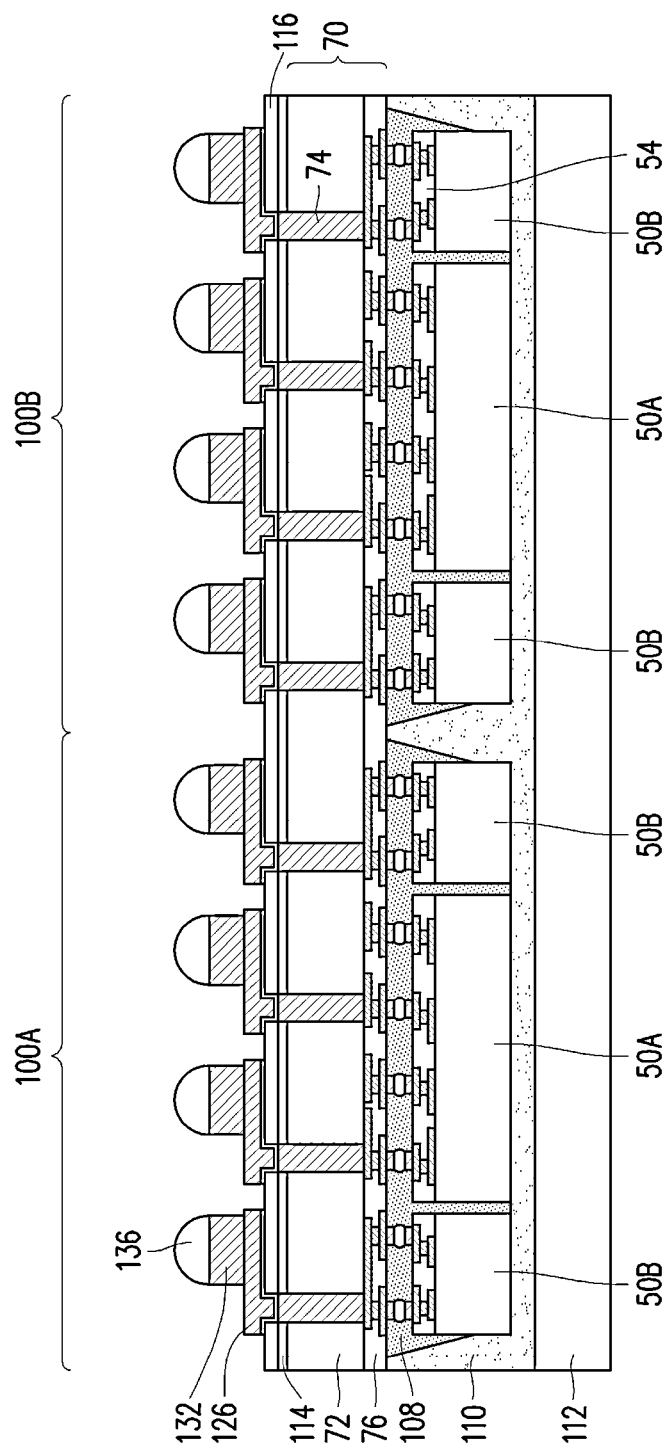

In FIG. 15, the first photoresist 122 and second photoresist 128 are removed by an acceptable ashing or stripping process, such as using an oxygen plasma or the like. Notably, the first photoresist 122 and second photoresist 128 are removed in a same removal process, with no intervening steps between removal of the second photoresist 128 and removal of the first photoresist 122. Removing both photoresists in a same process allows removal costs to be reduced. Once the photoresists are both removed, exposed portions of the seed layer 120 are removed, such as by using an acceptable etching process, such as by wet or dry etching.

Further, a reflow may be performed in order to shape the reflowable material 134 into desired bump shapes, thereby forming conductive connectors 136. The conductive connectors 136 may be ball grid array (BGA) connectors, solder balls, controlled collapse chip connection (C4) bumps, or the like.

The UBMs 126 laterally offsets the conductive bumps 132 and conductive connectors 136 from the through vias 74. In other words, the conductive bumps 132 and conductive connectors 136 are aligned along a first axis, and the through vias 74 are aligned along a different second axis. Further, the polymer material of the dielectric layer 116 acts as a buffer layer between the insulating layer 114 and UBMs 126. During thermal testing, the devices may be heated and cooled in cycles, resulting in repeated expansion and contraction of the conductive connectors 136. The buffer layer absorbs forces from the expansion of the conductive connectors 136, reducing the chances of cracking and/or delamination in the various layers of the interconnect structure 76 during thermal testing. Further, in accordance with some embodiments, the UBMs 126 and conductive bumps 132 are formed using only one seed layer, one photoresist removal process, and one seed layer removal process. Manufacturing costs of the UBMs 126 and buffering dielectric layer 116 may thus be reduced.

Figure 16:
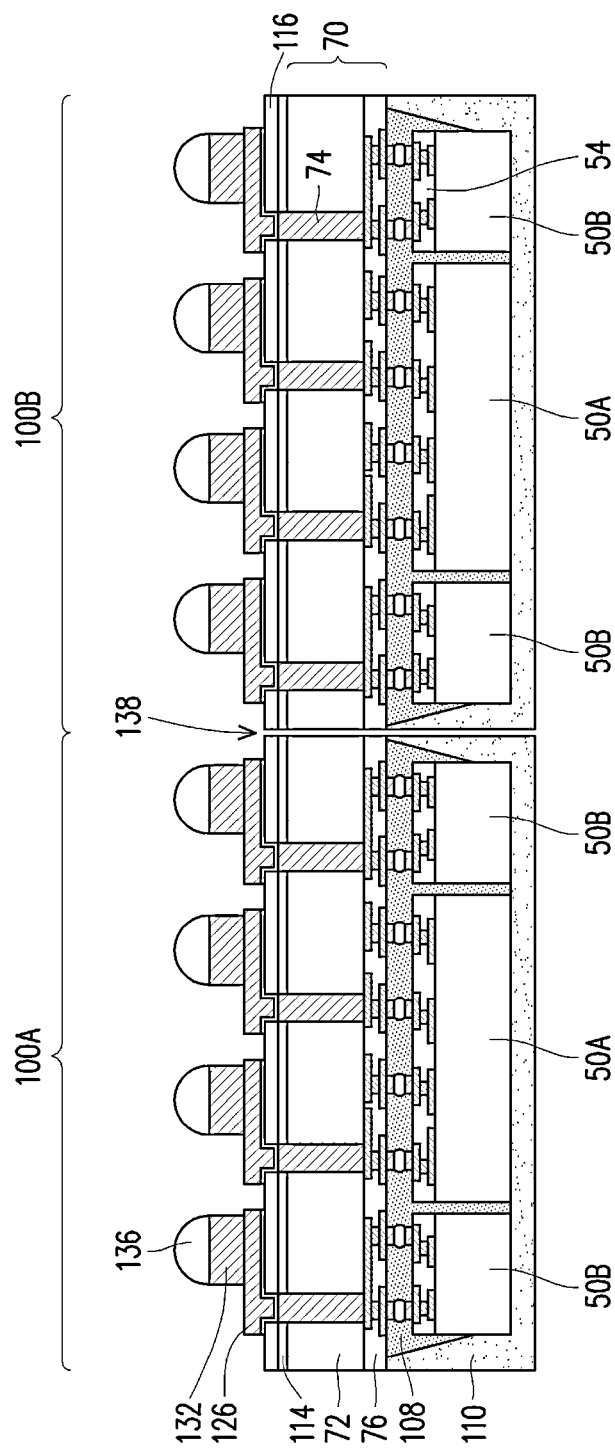

In FIG. 16, a carrier de-bonding is performed to detach (de-bond) the carrier substrate 112 from the encapsulant 11o. In accordance with some embodiments, the de-bonding includes projecting a light such as a laser light or an ultraviolet (UV) light on the release layer so that the release layer decomposes under the heat of the light and the carrier substrate 112 can be removed. The structure is then flipped over and placed on a tape (not illustrated). Subsequently, the wafer 70 is singulated between adjacent device regions 100A and 100B along scribe line regions 138 to form semiconductor devices 100. The singulation may be by sawing, dicing, or the like.

FIG. 17 shows a resulting semiconductor devices 100 after singulation. During the singulation process, interposers 140 are formed, which include singulated portions of the wafer 70, insulating layer 114, dielectric layer 116, and UBMs 126. Each of the semiconductor devices 100 has an interposer 140. As a result of the singulation process, edges of the interposers 140 and encapsulant 11o are coterminous. In other words, the outer sidewalls of the interposers 140 have the same width as the outer sidewalls of the encapsulant 110.

In FIG. 18, the device package 200 is formed by mounting the semiconductor device 100 to a package substrate 202. The package substrate 202 may be made of a semiconductor material such as silicon, germanium, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 202 may be a SOI substrate. Generally, an SOI substrate includes a layer of a semiconductor material such as epitaxial silicon, germanium, silicon germanium, SOI, or combinations thereof. The package substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for package substrate 202.

The package substrate 202 may include active and passive devices. As one of ordinary skill in the art will recognize, a wide variety of devices such as transistors, capacitors, resistors, combinations of these, and the like may be used to generate the structural and functional requirements of the design for the device package 200. The devices may be formed using any suitable methods.

The package substrate 202 may also include metallization layers and vias and bond pads 204 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 202 is substantially free of active and passive devices.

The conductive connectors 136 are reflowed to attach the semiconductor device 100 to the bond pads 204, thereby bonding the interposer 140 to the package substrate 202. The conductive connectors 136 electrically and physically couple the package substrate 202, including metallization layers in the package substrate 202, to the semiconductor device 100. In some embodiments, passive devices (e.g., surface mount devices (SMDs), not illustrated) may be attached to the device package 200 (e.g., bonded to the bond pads 204) prior to mounting on the package substrate 202. In such embodiments, the passive devices may be bonded to a same surface of the second device package 200 as the conductive connectors 136.

The conductive connectors 136 may have an epoxy flux formed thereon before they are reflowed with at least some of the epoxy portion of the epoxy flux remaining after the semiconductor device 100 is attached to the package substrate 202. This remaining epoxy portion may act as an underfill to reduce stress and protect the joints resulting from the reflowing the conductive connectors 136.

An underfill 206 may be formed between the semiconductor device 100 and the package substrate 202, surrounding the conductive connectors 136, conductive bumps 132, and UBMs 126. Due to the process for forming the UBMs 126, they are not surrounded by dielectric or insulating layers after formation. As such, the underfill 206 directly contacts and extends along sidewalls of the UBMs 126. Further, the underfill 206 is a continuous material extending from the package substrate 202 to the dielectric layer 116. The underfill 206 may be formed by a capillary flow process after the semiconductor device 100 is attached or may be formed by a suitable deposition method before the semiconductor device 100 is attached.

Optionally, a heat spreader may be attached to the device package 200, covering and surrounding the semiconductor device 100. The heat spreader may be formed from a material with high thermal conductivity, such as steel, stainless steel, copper, the like, or combinations thereof. The heat spreader protects the semiconductor device 100 and forms a thermal pathway to conduct heat from the various components of the device package 200.

Embodiments may achieve advantages. By using the UBMs 126 to laterally offset the conductive connectors 136 from the through vias 74, the conductive connectors 136 do not exert forces on the through vias 74 during thermal testing (e.g., expansion). Further, the dielectric layer 116 acts as a buffer layer for the UBMs 126. As a result, the chances of cracking and/or delamination in the various layers of the interconnect structure 76 during thermal testing may be reduced. Further, because the UBMs 126 and conductive bumps 132 are formed using only one seed layer, one photoresist removal process, and one seed layer removal process, manufacturing costs may be reduced.

In an embodiment, a method includes: attaching an integrated circuit device to a first side of an interposer, the interposer including a through via electrically connected to the integrated circuit device; depositing a dielectric layer over a second side of the interposer; patterning the dielectric layer to expose the through via; forming a first mask layer over the dielectric layer, the first mask layer having a first pattern over the through via; plating an under bump metallurgy (UBM) in the first pattern of the first mask layer; forming a second mask layer over the UBM and the first mask layer, the second mask layer having a second pattern exposing a portion of the UBM; plating a conductive bump in the second pattern of the second mask layer, the conductive bump being laterally offset from the through via; and removing the first mask layer and the second mask layer.

In some embodiments of the method, the first mask layer and the second mask layer are removed in a same removal process. In some embodiments, the method further includes: forming an underfill material between the integrated circuit device and the interposer. In some embodiments, the method further includes: encapsulating the integrated circuit device and the underfill material with a molding compound, the molding compound and the interposer being coterminous. In some embodiments of the method, the patterning the dielectric layer forms a first opening exposing the through via, and further including: depositing a seed layer over the dielectric layer and in the first opening, the first mask layer formed over the seed layer, the first pattern exposing the seed layer. In some embodiments of the method, no seed layer is formed between the UBM and the conductive bump. In some embodiments of the method, the UBM is plated with a first plating process, the conductive bump is plated with a second plating process, and the first plating process and the second plating process are performed with the same plating process parameters. In some embodiments, the method further includes: plating a reflowable material on the conductive bump in the second pattern of the second mask layer. In some embodiments, the method further includes: after the removing the first mask layer and the second mask layer, reflowing the reflowable material to form a conductive connector on the conductive bump.

In an embodiment, a method includes: forming a dielectric layer on an interposer, the interposer including a through via; patterning an opening in the dielectric layer; depositing a seed layer in the opening and along the dielectric layer; plating a first conductive material on the seed layer to form an under bump metallurgy (UBM) extending along the dielectric layer and through the opening, the first conductive material plated with the seed layer; and plating a second conductive material on the first conductive material to form a conductive bump laterally offset from the through via, the second conductive material plated with the seed layer.

In some embodiments, the method further includes: forming a first mask layer over the dielectric layer, the first mask layer having a first pattern exposing the seed layer, the first conductive material plated in the first pattern; and forming a second mask layer over the UBM and the first mask layer, the second mask layer having a second pattern exposing a portion of the UBM, the second conductive material plated in the second pattern. In some embodiments, the method further includes: removing the first mask layer and the second mask layer in a same removal process. In some embodiments of the method, no seed layer is formed on the UBM before the plating the second conductive material. In some embodiments, the method further includes: bonding the conductive bump to a package substrate with a conductive connector; and forming an underfill surrounding the UBM, the conductive bump, and the conductive connector.

In an embodiment, a device includes: a substrate having a first side and a second side opposite the first side; an interconnect structure adjacent the first side of the substrate; and an integrated circuit device attached to the interconnect structure; a through via extending from the first side of the substrate to the second side of the substrate, the through via being electrically connected to the integrated circuit device; an under bump metallurgy (UBM) adjacent the second side of the substrate and contacting the through via; a conductive bump on the UBM, the conductive bump and the UBM being a continuous conductive material, the conductive bump laterally offset from the through via; and an underfill surrounding the UBM and the conductive bump.

In some embodiments of the device, the underfill contacts sides of the UBM and sides of the conductive bump. In some embodiments, the device further includes: a dielectric layer adjacent the second side of the substrate, the UBM extending through the dielectric layer. In some embodiments, the device further includes: a seed layer extending through the dielectric layer to contact the through via, the UBM contacting the seed layer, where no seed layers are disposed between the conductive bump and the UBM. In some embodiments, the device further includes: a package substrate; and a conductive connector bonding the package substrate to the conductive bump, the underfill surrounding the conductive connector. In some embodiments of the device, the underfill is a continuous material extending from the package substrate to the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first integrated circuit device; and
   an interposer comprising:
   an interconnect structure, the first integrated circuit device bonded to the interconnect structure;
   a semiconductor substrate on the interconnect structure;
   an insulating layer on the semiconductor substrate;
   a dielectric layer on the insulating layer;
   an under bump metallurgy having a line portion disposed on the dielectric layer and having a via portion extending through the dielectric layer; and
   a conductive bump on the line portion of the under bump metallurgy, the conductive bump being laterally offset from the via portion of the under bump metallurgy, the conductive bump and the under bump metallurgy together being a single continuous metal, the conductive bump having a width measured where the conductive bump is joined to the line portion of the under bump metallurgy; and
   a through via connecting the via portion of the under bump metallurgy to the interconnect structure, the through via extending through the insulating layer and the semiconductor substrate, the width of the conductive bump being greater than a width of the through via.

2. The device of claim 1, further comprising:
   an underfill between the first integrated circuit device and the interposer; and
   an encapsulant around the underfill and the first integrated circuit device.

3. The device of claim 1, further comprising:
   a package substrate;
   a reflowable connector coupling the package substrate to the conductive bump; and
   an underfill between the package substrate and the interposer, the underfill contacting a sidewall of the reflowable connector, a sidewall of the conductive bump, and a sidewall of the under bump metallurgy, the sidewall of the conductive bump being laterally offset from the sidewall of the under bump metallurgy.

4. The device of claim 3, wherein the underfill has a surface facing away from the dielectric layer, the conductive bump has a surface facing away from the dielectric layer, and the surface of the underfill is disposed further from the dielectric layer than the surface of the conductive bump.

5. The device of claim 1, further comprising:
   a second integrated circuit device adjacent the first integrated circuit device and bonded to the interconnect structure, the second integrated circuit device having a different function than the first integrated circuit device.

6. The device of claim 1, wherein the width of the conductive bump is constant along a direction extending away from the under bump metallurgy.

7. A device comprising:
   a semiconductor substrate having a first side and a second side opposite the first side;
   an interconnect structure adjacent the first side of the semiconductor substrate;
   a through via extending from the first side of the semiconductor substrate to the second side of the semiconductor substrate, the through via connected to the interconnect structure;
   an under bump metallurgy adjacent the second side of the semiconductor substrate, the under bump metallurgy connected to the through via;
   a conductive bump on the under bump metallurgy, the conductive bump laterally offset from the through via, the conductive bump and the under bump metallurgy being a continuous metal without intervening seed layers at an interface of the conductive bump and the under bump metallurgy, the interface of the conductive bump and the under bump metallurgy having a width that is greater than a width of the through via; and an underfill surrounding the conductive bump and the under bump metallurgy.

8. The device of claim 7, further comprising:
an integrated circuit device connected to the interconnect structure; and
an encapsulant around the integrated circuit device.

9. The device of claim 8, wherein the integrated circuit device is bonded to the interconnect structure with hybrid bonds.

10. The device of claim 8, wherein the integrated circuit device is bonded to the interconnect structure with solder bonds.

11. The device of claim 7, further comprising:
a package substrate; and
a reflowable connector coupling the package substrate to the conductive bump, the underfill surrounding the reflowable connector, a width of the reflowable connector being greater than a width of the through via.

12. The device of claim 7, wherein the underfill contacts a sidewall of the conductive bump, a sidewall of the under bump metallurgy, and a horizontal surface of the under bump metallurgy, the horizontal surface of the under bump metallurgy extending between the sidewall of the under bump metallurgy and the sidewall of the conductive bump.

13. The device of claim 7, further comprising:
a dielectric layer adjacent the second side of the semiconductor substrate, a first portion of the under bump metallurgy extending through the dielectric layer, a second portion of the under bump metallurgy extending along the dielectric layer; and
an insulating layer between the dielectric layer and the semiconductor substrate, the through via extending through the insulating layer.

14. A device comprising:
a semiconductor substrate having a first side and a second side opposite the first side;
a through via extending from the first side of the semiconductor substrate to the second side of the semiconductor substrate;
an interconnect structure on the first side of the semiconductor substrate, the interconnect structure comprising a metallization pattern connected to the through via;
a dielectric layer on the second side of the semiconductor substrate;
a conductive feature comprising a continuous conductive material, the continuous conductive material having:
a via portion extending through the dielectric layer, the via portion connected to the through via;
a line portion on the via portion and the dielectric layer; and
a bump portion on the line portion, the bump portion laterally offset from the via portion, the bump portion having a width that is constant along a direction extending away from the line portion, the width of the bump portion being greater than a width of the via portion.

15. The device of claim 14, further comprising:
an integrated circuit device attached to the interconnect structure, the integrated circuit device connected to the metallization pattern of the interconnect structure.

16. The device of claim 15, further comprising:
an underfill between the interconnect structure and the integrated circuit device; and
an encapsulant around the underfill and the integrated circuit device.

17. The device of claim 14, further comprising:
a package substrate; and
a reflowable connector coupling the package substrate to the bump portion of the conductive feature.

18. The device of claim 17, further comprising:
an underfill between the package substrate and the line portion of the conductive feature, the underfill surrounding the reflowable connector.

19. The device of claim 18, wherein the underfill contacts a surface of the line portion of the conductive feature that faces away from the dielectric layer.

20. The device of claim 14, wherein the conductive feature further comprises a seed layer between the continuous conductive material and each of the through via and the dielectric layer.

* * * * *